United States Patent [19]

Shiwaku

[11] Patent Number: 5,182,560
[45] Date of Patent: Jan. 26, 1993

[54] ANALOG-TO-DIGITAL CONVERTER FOR HIGH SPEED LOW POWER APPLICATIONS

[75] Inventor: Noboru Shiwaku, Dallas, Tex.

[73] Assignee: Texas Instruments Incorporated, Dallas, Tex.

[21] Appl. No.: 455,126

[22] Filed: Dec. 22, 1989

[51] Int. Cl.$^5$ .................... H03K 5/24; H03K 3/297
[52] U.S. Cl. ........................... 341/158; 307/530; 330/258
[58] Field of Search ............ 341/158; 330/258; 307/359, 530, 355, 360, 352, 362

[56] References Cited

U.S. PATENT DOCUMENTS

| | | | |
|---|---|---|---|
| 3,668,691 | 6/1972 | Sergo | 341/158 |
| 4,218,675 | 8/1980 | Shaw et al. | 341/158 |
| 4,264,832 | 4/1981 | Furman | 307/355 |
| 4,479,094 | 10/1984 | Harris | 307/565 X |
| 4,523,110 | 6/1985 | Johnson | 307/355 X |
| 4,523,180 | 6/1985 | Kuboki et al. | 341/158 |
| 4,547,685 | 10/1985 | Wong | 307/530 |
| 4,743,784 | 5/1988 | Obara et al. | 307/530 |
| 4,799,041 | 1/1989 | Layton | 341/158 |
| 4,800,591 | 1/1989 | Sato | 341/158 |
| 4,803,462 | 2/1989 | Hester et al. | 341/172 |
| 4,814,648 | 3/1989 | Hynecek | 307/355 X |
| 4,831,381 | 5/1989 | Hester | 341/172 |
| 4,866,444 | 9/1989 | Nejime et al. | 341/158 |
| 4,933,644 | 6/1990 | Fattaruso et al. | 330/258 |
| 4,962,323 | 10/1990 | Ta | 307/355 X |
| 4,965,468 | 10/1990 | Nicollini et al. | 307/530 |
| 5,028,815 | 7/1991 | Van de Plassche | 307/355 |
| 5,032,744 | 7/1991 | Liu | 307/355 X |

FOREIGN PATENT DOCUMENTS 0258842 3/1988 European Pat. Off. ............ 341/158
3622985 1/1988 Fed. Rep. of Germany ....... 341/158

OTHER PUBLICATIONS

Wu et al., A 100-MHz Pipelined Comparator, IEEE Journal of Solid State Circuits, Dec. 1988 vol. 23 No. 6 pp. 1379-1385.
Wu et al., "A 100MHz Pipelined CMOS Comparator for Flash A/D Conversion," IEEE 1988 Custom Integrated Circuits Conf., pp. 18.3.1-18.3.4.
Akira Yukawa, "A CMOS 8-Bit High-Speed A/D Converter IC," IEEE Journal of Solid-State Circuits, vol. SC-20, No. 3, Jun. 1985, pp. 775-779.

Primary Examiner—Howard L. Williams
Attorney, Agent, or Firm—Troy J. Cole; Dana L. Burton; Richard L. Donaldson

[57] ABSTRACT

A high speed, low power parallel analog-to-digital converter (100) with comparator ($C_j$) having sense amplifiers operating with low power, high speed and a ROM encoder (130) also operating in low power, high speed regime.

9 Claims, 8 Drawing Sheets

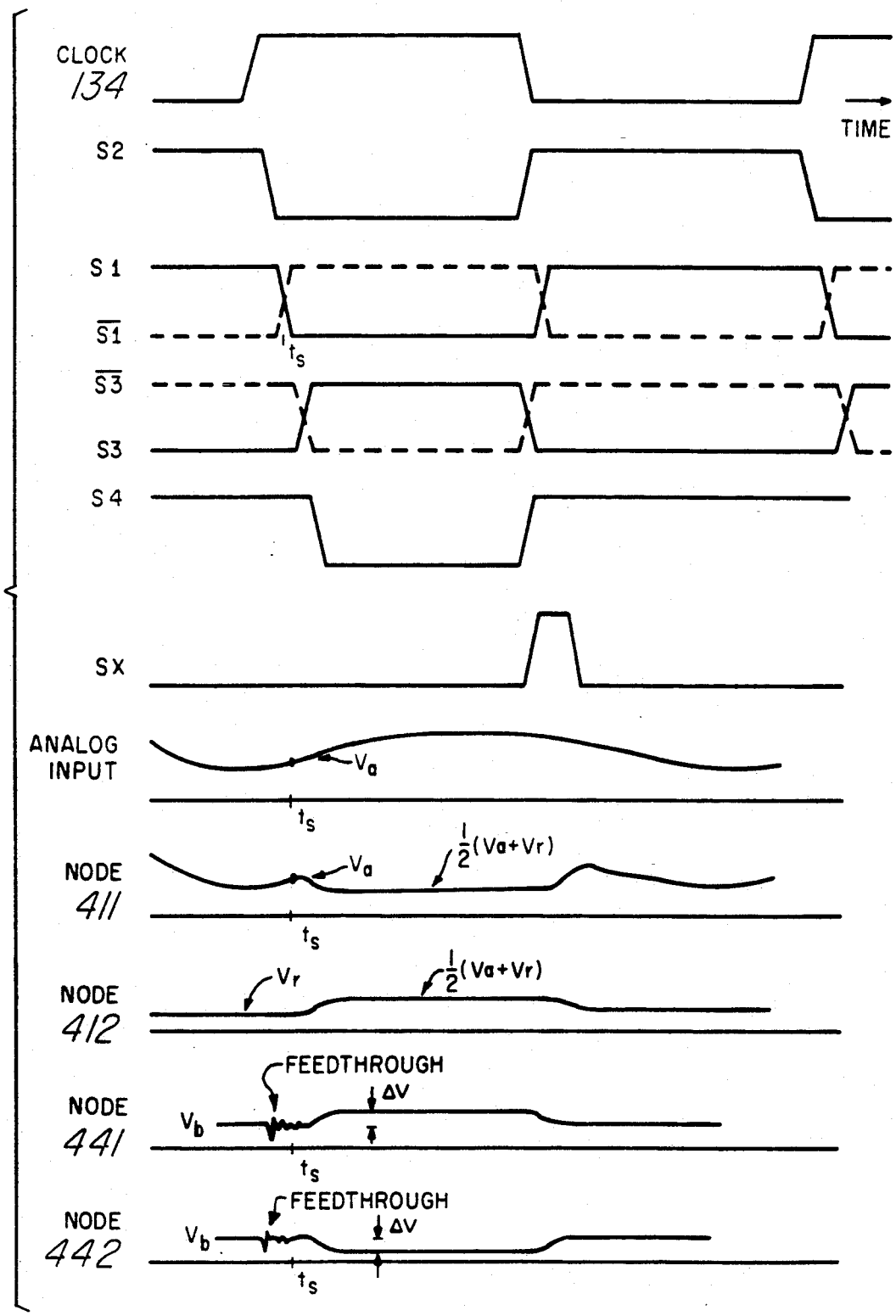

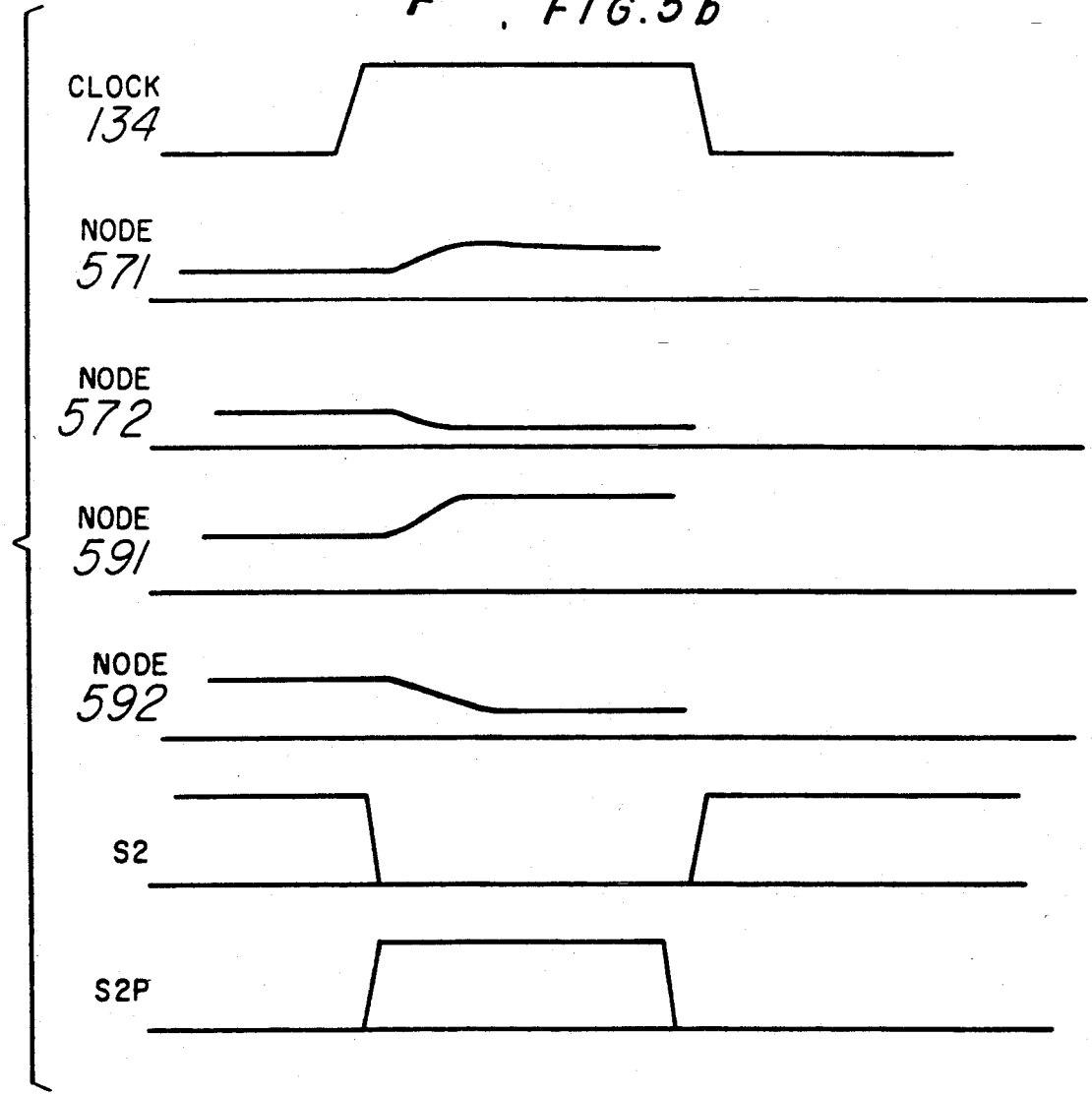

ANALOG-TO-DIGITAL CONVERTER FOR HIGH SPEED LOW POWER APPLICATIONS

CROSS-REFERENCE TO RELATED APPLICATIONS

Copending U.S. application Ser. No. 287,924, filed Dec. 21, 1988 (Richardson), discloses related subject matter. This cross-referenced application is assigned to the assignee of this application.

BACKGROUND OF THE INVENTION

1. Field of the Invention

The present invention relates to electronic devices and systems, and, more particularly, to analog-to-digital converters and systems containing them.

2. Description of the Related Art

Analog-to-digital converters are necessary parts of any system that uses digital techniques to process or analyze real-world electrical data. For example, digital television converts the analog broadcast signal to a digital signal for digital image processing and frame storage. The processed digital signal is then typically converted back to an analog signal for picture tube control. Similarly, video cassette recorders (VCRs) and combination video cameras plus recorders (Camcorders) and digital audio tape systems (DATs) may use digital signal processing after converting analog video signals to digital.

Other analog signals such as those found in hard disk drives, speech, sonar, radar, seismic, electrocardiogram, and mixed analog/digital telecommunications signals may be digitized for processing to extract characteristic parameters, remove noise, cancel echoes, deconvolve, and perform other operations. Fast Fourier transforms and other efficient digital algorithms permit real time processing and demand real time ananlog-to-digital converters. See, generally, Analog-Digital Conversion Handbook (Prentice-Hall 1986) for a discussion of types of analog-to-digital (and digital-to-analog) converters and applications.

However, it is a problem of the known analog-to-digital converters to provide both low power and high speed operation. Converters such as disclosed in U.S. Pat. Nos. 4,803,462 (Hester et al) and 4,831,381 (Hester) use arrays of capacitors. One approach uses CMOS integrated circuit technology and a parallel ("flash") architecture for high speed; see J-T. Wu and B. Wooley, A 100 MHz Pipelined CMOS Comparator for Flash A/D Conversion, IEEE 1988 Custom Integrated Circuits Conference 18.3.1 and A. Yukawa, A CMOS 8-Bit High-Speed A/D Converter IC, 20 IEEE J.Sol.St.Cir. 775 (1985). These approaches have the problem of relatively high power consumption for high enough speed operation.

SUMMARY OF THE INVENTION

The present invention provides a parallel analog-to-digital converter and systems with such converters where the converter has comparators having quick discharge circuitry, common mode feed through capacitors, offset cancellation capacitors, and clamp circuitry plus an encoder with full differential structure.

This solves the problems of known converters and provides high speed, low power parallel analog-to-digital converters and systems requiring such converters.

BRIEF DESCRIPTION OF THE DRAWINGS

The drawings are schematic for clarity.

DESCRIPTION OF THE PREFERRED EMBODIMENTS

Figure 1:
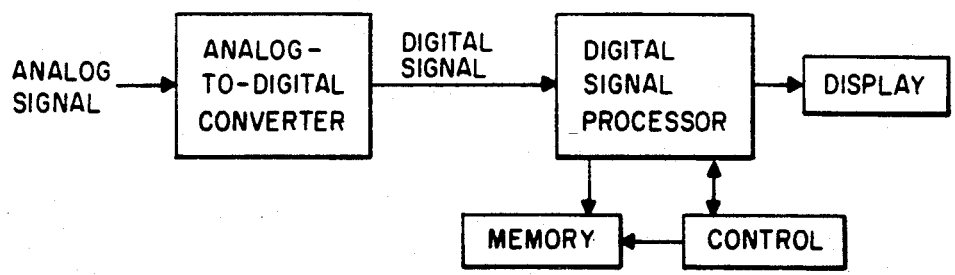
FIG. 1 is a block diagram of a system including analog-to-digital conversion.

FIG. 1 is a schematic block diagram of a generic system that receives analog input signals and converts such signals to digital format for processing and then displays the processed signals. Digital television would be an example of such a system with the analog input provided by an antenna and mixer and channel selector and the display including a digital-to-analog converter and a picture tube.

Figure 2:
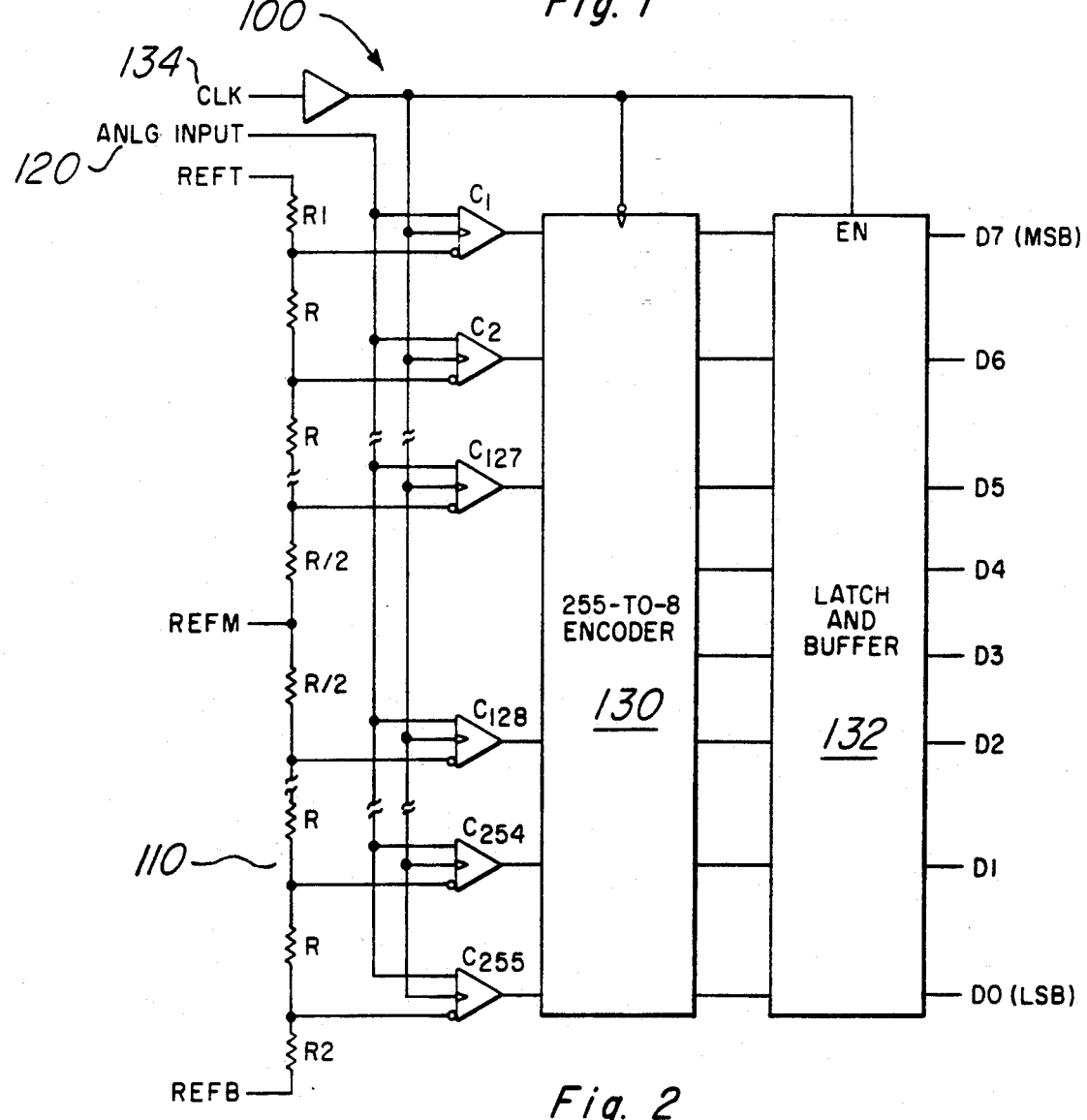
FIG. 2 is a block diagram of a first preferred embodiment analog-to-digital converter.

FIG. 2 is a schematic block diagram of a first preferred embodiment analog-to-digital converter, generally denoted by reference numeral 100. Converter 100 is an 8-bit converter and includes an array of 255 comparators, labelled $C_1, C_2, \ldots, C_{255}$; a resistive voltage divider 110 which provides a separate reference voltage for each of the comparators $C_1, C_2, \ldots, C_{255}$; an input terminal 120 which provides the analog input to be digitized to each of the comparators $C_1, C_2, \ldots, C_{255}$; 255-to-8 encoder 130 that encodes the output of comparators $C_1, C_2, \ldots, C_{255}$ as an 8-bit word; latch and buffer 132 for holding the output of encoder 130; and clock 134 for timing. Clock 134 includes a set of seven closely related clock signals and is described in FIG. 4$b$. The difference between successive reference voltages is the resolution of converter 100 and corresponds to the least significant bit in the 8-bit output. The convertible analog input range is 256 times this difference between successive reference voltages. Typical values would be an analog input varying within a range of about 2 volts and a resolution of about 8 millivolts, although converter 100 can operate with an analog input having the full supply voltage to ground range. Converter 100 operates essentially as follows: (i) during a first phase of clock 134 the analog input on input 120 and a reference voltage from divider 110 are sampled by each comparator $C_j$; the analog input is the same for all comparators, but the reference voltage decreases from $C_1$ to $C_{255}$. (ii) During a second phase of clock 134 a regenerative sense amplifier in each comparator $C_j$ senses the difference between the sampled analog and that comparator's reference voltage, and each comparator $C_j$ provides an output that is either high or low depending upon whether the sampled analog input was greater than or less than the reference voltage for that comparator. Thus for a given sampled analog input there will be some n such that the output of each of comparators $C_1, C_2, \ldots, C_n$ will be high and the output of each of comparators $C_{n+1}, C_{n+2}, \ldots, C_{255}$ will be low. In other words, the sampled analog input approximately equals the reference voltage applied to $C_n$. This output code (a string of n 1's followed by 255−n 0's) is sometimes called a thermometer code. (iii) During a third phase of clock 134 encoder 130 corrects some errors (such as the output of $C_{n+2}$ also high) and then encodes the thermometer code output as an 8-bit word that is the binary representation of n. This 8-bit word is then held in latch and buffer 132.

Figure 3:
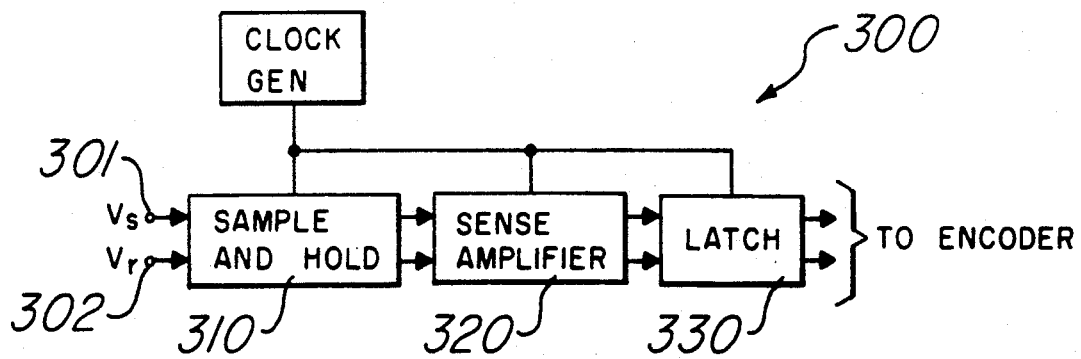
FIG. 3 is a block diagram of a comparator of the first preferred embodiment.
Figure 4A:
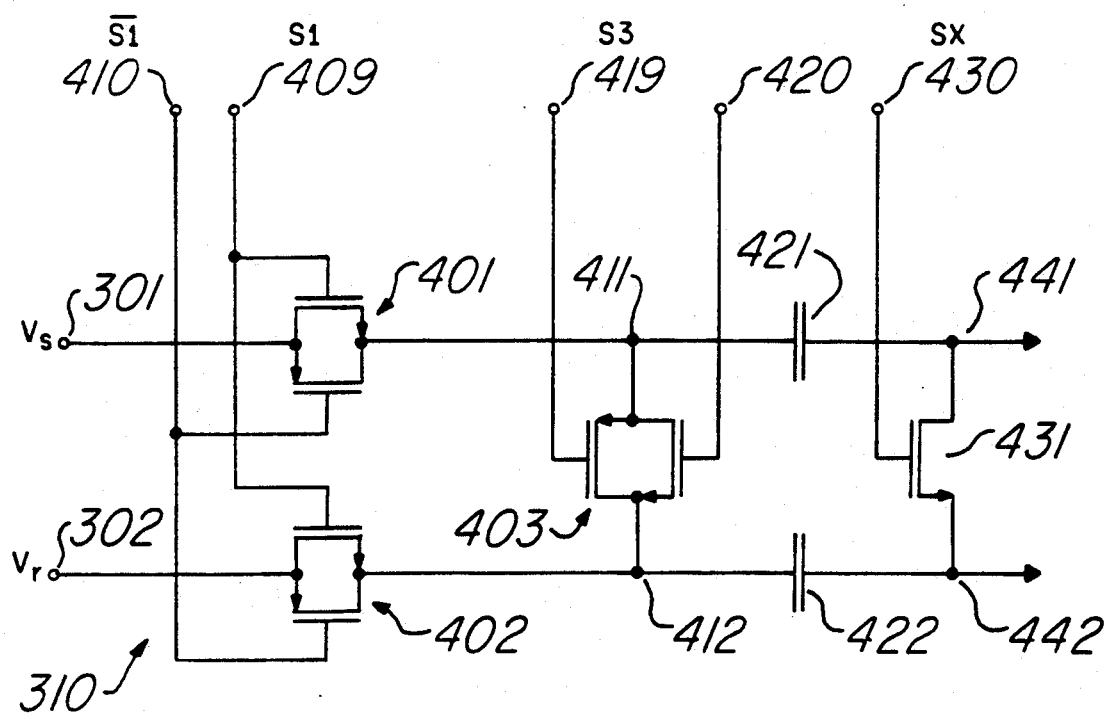
FIGS. 4$a$–$b$ are diagrams of a sampling circuit of the first preferred embodiment.

FIG. 3 is a block diagram of one of the comparators $C_1, C_2, \ldots, C_{255}$ and is generally referred to by reference numeral 300. Comparator 300 includes sample and hold circuit 310, sense amplifier 320, and latch 330. Sample and hold circuit 310 is shown in FIG. 4a and operates as follows with a timing diagram in FIG. 4b:

(a) Clock 134 provides seven signals labelled S1, S1, S2, S3, S3, S4 and SX (see the upper portion of FIG. 4b). Each phase of the clock 134 has a duration of about 15 nanoseconds, the falling edge of S2 is delayed about 200 picoseconds from the rising edge of clock 134, the S1 is delayed about 200 picoseconds from S2, the rising edge of S3 is delayed about 200 picoseconds from the falling edge of S1, the falling edge of S4 is delayed about 200 picoseconds from the rising edge of S3, and SX has a high duration of about 1.5 nanoseconds with a rising edge aligned with the falling edge of clock 134. During a low phase of clock 134 (far lefthand portion of FIG. 4b) S1 is high and S1 is low and these signals are applied to terminals 409 and 410 to turn on pass transistor pairs 401 and 402 (each of these pass transistor pairs is an n channel MOSFET in parallel with a p channel MOSFET and with the gates receiving comlementary signals, so the turn on is sharp for passing both high and low signals). This turn on connects node 411 with the analog input applied at terminal 301 and node 412 with the reference voltage from resistor network 110 applied at terminal 302. The S3 and S3 signals applied to terminals 420 and 419 turn off pass transistor pair 403 to isolate node 411 from node 412; thus the analog input voltage is applied to capacitor 421 and the reference voltage $V_r$ to capacitor 422. During this low phase of clock 134 when S1 is high and S3 low the analog input may be varying and thus the voltage on capacitor 421 (node 411) tracks the analog input. Also during the first part of the clock 134 low phase the nodes 441 and 442 are tied together by transistor 431 being turned on by signal SX, and during all of the low phase nodes 441 and 442 are being discharged through transistors 505 and 506 (see FIG. 5a) to a level $V_b$ about 0.2 volt above the threshold voltage of n channel transistors 510 and 511. This is about 1 volt above $V_{SS}$. See the lefthand portion of FIG. 4b.

(b) The rising edge of clock 134 begins the sampling and comparison: S1 falls to low and S1 rises to high and this turns off pass transistor pairs 401 and 402 to isolate nodes 411 and 412 from terminals 301 and 302. This is the end of the sampling time of the analog input by capacitor 421, denoted as $t_s$ in FIG. 4b. The corresponding sampled analog input is denoted as $V_a$. Recall that the other plates of capacitors 421 and 422 are about at $V_b$, so the potential across the plates of capacitor 421 is $V_a - V_b$ and the potential across the plates of capacitor 422 is $V_r - V_b$ at time $t_s$.

(c) Just after transistor pairs 401 and 402 are turned off by S1 and S1, transistor pair 403 is turned on by S3 and S3; this connects node 411 to 412 and the potential difference between the nodes ($V_a - V_r$) induces potential changes in nodes 441 and 442, which have previously been isolated by S2 going low. If the capacitance $C'$ of node 441 to ground exclusive of capacitor 421 equals the capacitance of node 442 to ground exclusive of capacitor 422, and the capacitance C of capacitor 421 equals that of capacitor 422, then the potential of node 441 changes to $V_b - \Delta V$ and the potential of node 442 change to $V_b + \Delta V$ where $$\Delta V = \frac{V_a - V_r}{2(1 + C'/C)}$$

Thus, if the sampled analog input $V_a$ is greater than the reference voltage $V_r$, then $\Delta V$ is positive and the potential of node 441 is less than the potential of node 442. Conversely, if $V_a$ is less than $V_r$, $\Delta V$ is negative and the potential of node 441 is greater than the potential of node 442. This is illustrated in the central portion of FIG. 4b for $V_a$ greater than $V_r$. Nodes 441 and 442 connect to the inputs of sense amplifier 320 shown in FIG. 5a.

Figure 5A:
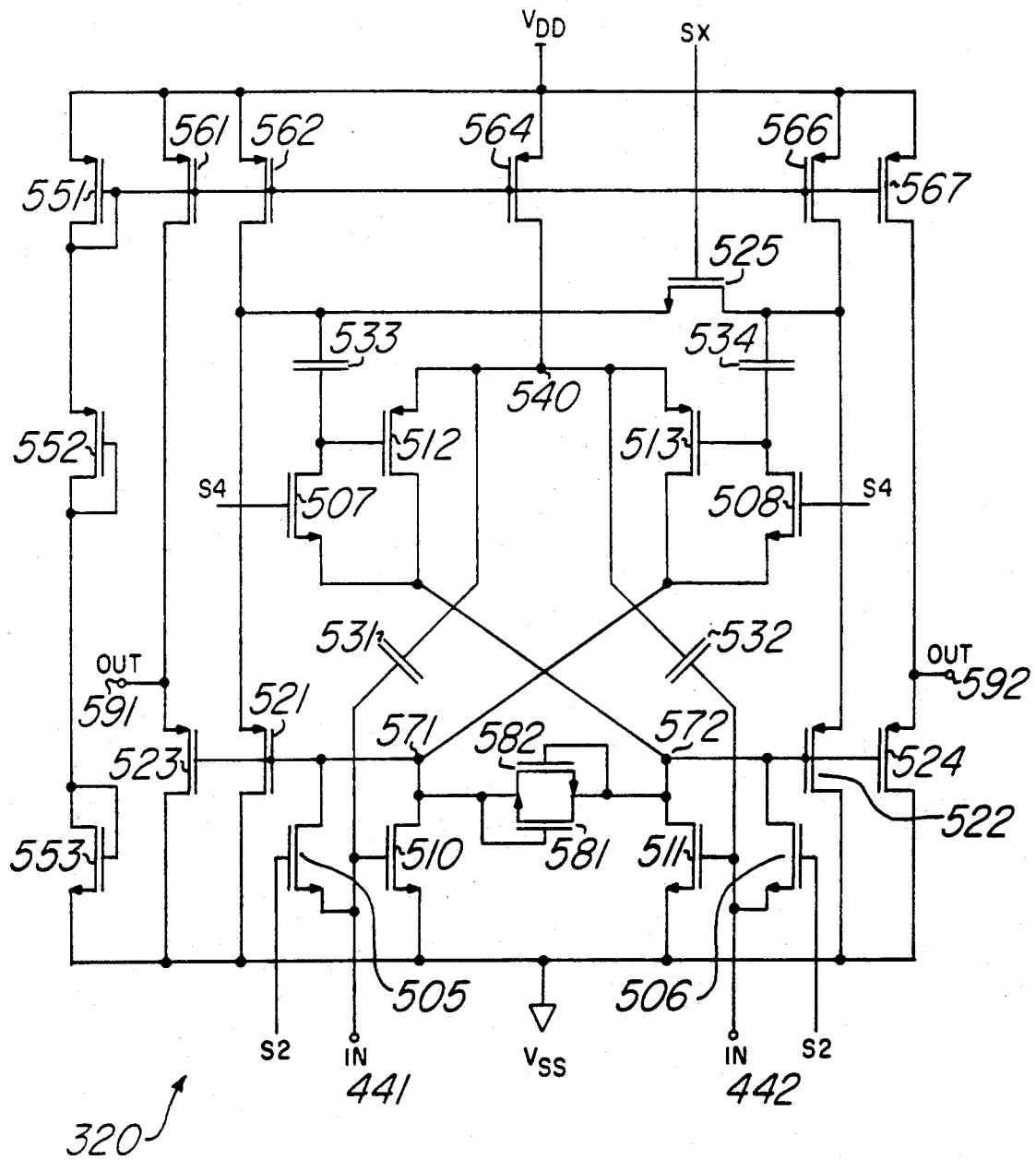
FIGS. 5$a$–$b$ are diagrams of a sense amplifier of the first preferred embodiment.

FIG. 5a is a schematic diagram of sense amplifier 320 with inputs labelled 441 and 442 because these coincide with the output nodes of sample and hold circuit 310. Sense amplifier 320 is essentially a cross coupled pair of p channel transistors 512 and 513 that are imbalanced by n channel transistors 510 and 511 which are biased by input nodes 441 and 442. Sense amplifier 320 operates as follows with FIG. 5b a timing diagram:

(a) Series diode connected transistors 551, 552, and 553 provide a gate bias for p channel transistors 561, 562, 564, 566, and 567; thus each pair 551-56x is a current mirror. In particular, the current through transistor 564 is split into two branches: one along p channel 512 and n channel 511 and the other along p channel 513 and n channel 510. Note that all the p channel transistors have a substrate bias of $V_{DD}$ and all the n channel transistors have a substrate bias of $V_{SS}$ as is typical in CMOS structures which have the n well biased at $V_{DD}$ and the p well biased at $V_{SS}$.

(b) During the low phase of clock 134 S2 is high and turns on n channel transistors 505 and 506, and S4 is high and turns on n channel transistors 507 and 508. Transistors 505 and 508 connect node 441, capacitors 531 and 534, the gate of n channel transistor 510, and the gate of p channel transistor 513 to node 571 and discharges them through transistor 510 to about $V_b$ which is the threshold voltage of the n channel transistors plus about 0.2 volt; similarly, transistors 506 and 507 discharge node 442, capacitors 532 and 533, and the gates of p channel transistor 512 and n channel transistor 511 to about $V_b$. Also, during the first 1.5 nanoseconds of this low clock phase transistor 525 is turned on by SX to speed the discharge of capacitors 533 and 534. Recall that during the first part of the low clock phase signal SX also turns on transistor 431 in sample and hold circuit 310 to tie nodes 441 and 442 together and further speed the discharge. Note that the potential at output nodes 591 and 592 is about $\frac{1}{2}V_{DD}$, typically 2.5 volts. Additionally, diode connected transistors 581 and 582 prevent the difference in potential between nodes 571 and 572 from exceeding the n channel threshold voltage at all times and prevents saturation of sense amplifier 320 and helps quick discharge. At the end of the low phase of clock 134 nodes 571 and 572 are about $V_b$ (typically 1 volt), node 540 is typically at about 4 volts, capacitors 533 and 534 typically have a charge of about 1.5 volts (potential of about 2.5 volts on transistor 525 side and 1.0 volt on transistors 507, 508 side), and capacitors 531 and 532 typically have a charge of about 3 volts.

(c) After just 1.5 nanoseconds of the low clock phase, transistors 431 and 525 are turned off. This disconnects nodes 441 and 442 and also disconnects capacitors 533 and 534. The exact potentials of nodes 441 and 442 then depend upon the exact potentials of nodes 571 and 572 which, in turn, depend upon the the exact threshold voltages of transistors 510, 511, 512, and 513 and the current split from current source 551–564; and thus capacitors 421 and 422 will store slightly difference charges which compensates for the offset voltage of sense amplifier 310. Such offset voltages are typically on the order of a few millivolts. Note that the use of capacitors 421 and 422 for both the analog input/reference voltage detection and the offset compensation contributes to low input capacitance of converter 300 and low power, high speed sense amplifier performance. Similarly, the exact charges stored on capacitors 533 and 534 depend upon the exact potentials of nodes 571 and 572, and capacitors 533 and 534 will store charges that compensate for the offset voltage of the feedback of the cross coupling of transistors 512 and 513 through the output stage with transistors 521, 522, 523, and 524 (explained in more detail below).

(d) At the falling edge of S2 transistors 505 and 506 turn off to disconnect node 441 from node 571 and disconnect node 442 from node 572; and this falling edge feeds through the gate-source capacitance of transistors 505 and 506 and would drive the gates of transistors 510 and 511 low and disrupt the bias current flow from transistor 564 through the two branches 512–511 and 513–510. The transitions of the other clock signals also feed through. See feed through glitch in FIG. 4b. The low bias current from transistor 564 makes such glitches significant, but a low bias current is necessary for low power operation. However, capacitors 531 and 532 pass the feed through falling edge of the clock signals to node 540 and avoid the disruption of the bias current illustrated in FIG. 4b. This common mode feed through by capacitors 531 and 532 also permits the analog input range to be extended from $V_{SS}$ to $V_{DD}$ without disrupting operation. After S2 has isolated nodes 441 and 442, S3 and S3 turn on transistor pair 403 to induce $\pm \Delta V$ on nodes 441 and 442 as previously explained. This $\pm \Delta V$ on nodes 441 and 442 changes the conductance of the channels in transistors 510 and 511; for example, if $V_a$ is greater than $V_r$, then the potential of node 441 decreases and that of node 442 increases and the channel conductance of transistor 510 decreases and that of transistor 511 increases. Thus the potential of node 571 rises and that of node 572 drops; and this decreases channel conductance of p channel transistors 521 and 523 and increases that of p channel transistors 522 and 524. Note that transistors 521, 522, 523, and 524 are each setup as a source follower with loads being the current mirror sources provided by transistors 561, 562, 566, and 567. These changes in source potential of transistors 521 and 522 are passed through capacitors 533 and 534 so that the potential on the gate of p channel transistor 512 increases and that on the gate of p channel transistor 513 decreases. S4 has fallen to isolate the gates of 512 and 513. Thus the channel conductance of transistor 512 decreases and that of transistor 513 increases, and this reinforces the increasing of the potential of node 571 and the decreasing of the potential of node 572. This positive feedback quickly drives node 571 up to about 1.8 volts and node 572 down to about 0.8 volt. Recall that transistor pair 581–582 keeps the potential difference between nodes 571 and 572 to about the n channel transistor threshold voltage. Because the potentials of nodes 571 and 572 are also the gate potentials for p channel transistors 523 and 524, node 571 going high increases the channel conductance of 523 to drive output 591 up to about 3.2 volts and node 572 going low drives output 592 down to about 2.0 volts. See the middle panel of FIG. 5b.

Figure 6:
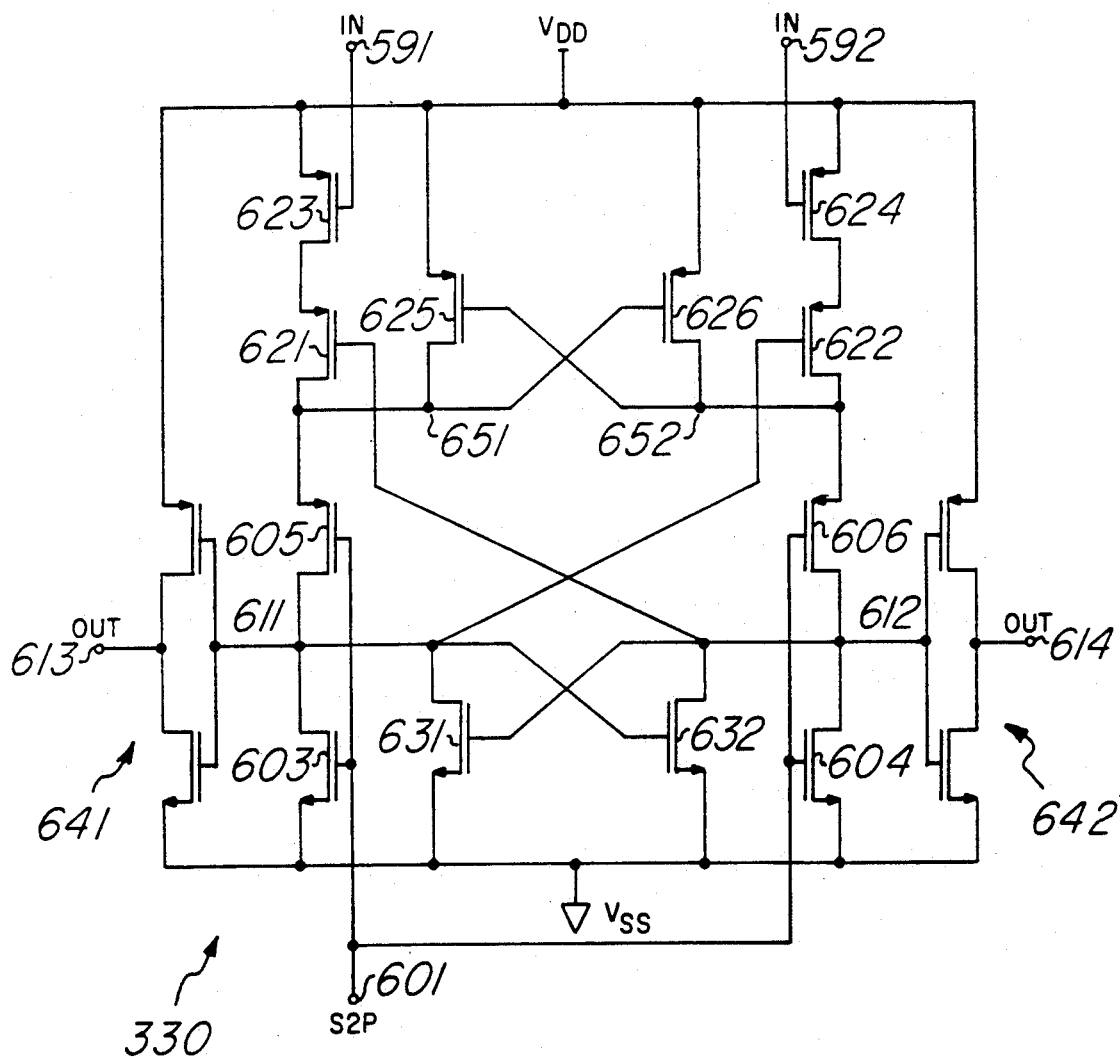
FIG. 6 is a diagram of a latch of the first preferred embodiment.

The outputs of sense amplifier 320 are fed into latch 330 to convert the outputs to a digital signal and latch it. FIG. 6 is a schematic of latch 330 with the inputs denoted 591 and 592 because they coincide with the outputs of sense amplifier 320. During a further clock signal S2P high phase the input at node 601 is high and turns on n channel transistors 603 and 604 and turns off p channel transistors 605 and 606; this pulls nodes 611 and 612 low and outputs 613 and 614 both go to $V_{DD}$. Also during the S2P high phase p channel transistors 621 and 622 are on because their gates are tied to nodes 611 and 612; and inputs 591 and 592 have the outputs of sense amplifier 320 (node 591 being about 3.2 volts and node 592 being about 2 volts in the example of $V_a$ greater than $V_r$). During the S2P high phase nodes 651 and 652 are charged up through transistors 621–623 and 622–624. Thus the cross coupled pair 625–626 are asymmetrically loaded but not conducting.

A transition of S2P phase to low turns on p channel transistors 605 and 606 and the asymmetry in the pair 625–626 is also applied to cross coupled n channel transistors 631–632 and the cross coupled pairs latch into one transistor of each pair turned on by the regenerative feedback. For the example with node 591 relatively high and node 592 relatively low, transistors 626 and 631 are turned on and pull node 611 low and node 612 high. The potential of nodes 611 and 612 are inverted by CMOS inverters 641 and 642 and appear on output nodes 613 and 614 at $V_{DD}$ or $V_{SS}$. Transistors 621 and 622 contribute to low power operation by use of the feedback gate voltage of nodes 611 and 612.

Figure 7:
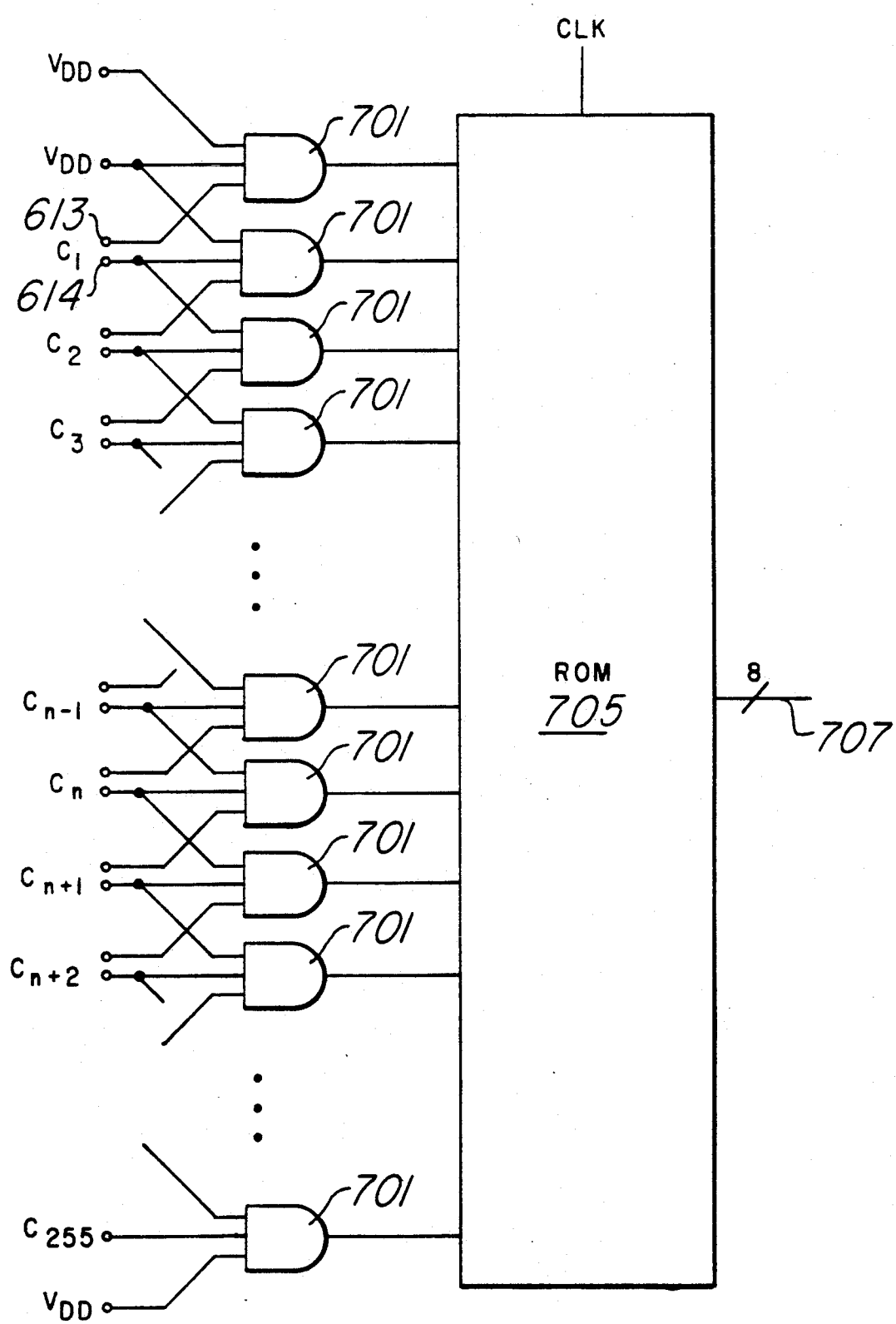
FIG. 7 is a block diagram of an encoder of the first preferred embodiment.

FIG. 7 is a block diagram encoder 130 which converts the outputs of the 255 latches 330 into an 8-bit number. Recall that if the sampled analog signal $V_a$ was less than the reference voltage $V_r$ for comparators $C_1$, $C_2, \ldots, C_n$ and greater than for comparators $C_{n+1}, \ldots, C_{255}$, then the node 613 outputs of the 255 latches 330 should consist of $V_{DD}$ for $C_1, C_2, \ldots, C_n$ and $V_{SS}$ for $C_{n+1}, \ldots, C_{255}$. These outputs are then input to AND gates 701 by threes with each output going to three adjacent AND gates and with the highest labelled input for each AND gate inverted; that is, from node latch output node 614 rather than from output node 613. Note that OR gates could also be used. For each j the direct outputs of $C_j$ and $C_{j-1}$ plus the inverted output of $C_{j+1}$ are input to the $j^{th}$ AND gate. (The 256 AND gates are labelled from 0 to 255.) The $0^{th}$ AND gate has two inputs of $V_{DD}$ and the inverted output of $C_1$; the $1^{st}$ AND gate has one input of $V_{DD}$, one the direct output of $C_1$, and one the inverted output of $C_2$; and the $255^{th}$ AND gate has inputs of the direct output of $C_{254}$ and $C_{255}$ and one input the inverted $V_{SS}$ (i.e., $V_{DD}$). The effect of this ANDing is to change the outputs coded as a string of n $V_{DD}$s and 255−n $V_{SS}$s into a single $V_{DD}$ from the $n^{th}$ AND gate (with inputs from $C_{n-1}$, $C_n$ and $C_{n+1}$) and $V_{SS}$s from all of the other AND gates. In other words, only the pattern of ($V_{DD}, V_{DD}, V_{SS}$) on three successive comparator outputs will generate a $V_{DD}$ AND gate 701 output. This single $V_{DD}$ is then used as the address input of ROM 705 which outputs the 8-bit word that is the binary code for n on 8-bit bus 707 to latch and buffer 132.

However, errors in comparator outputs may arise, especially for the comparators $C_j$ with $j \approx n$ because the difference between $V_a$ and $V_r$ is very small. Such errors are corrected to some extent by the array of AND gates 701 simply because only the pattern ($V_{DD}$, $V_{DD}$, $V_{SS}$) generates the high output to be encoded by ROM 705.

Figure 8:
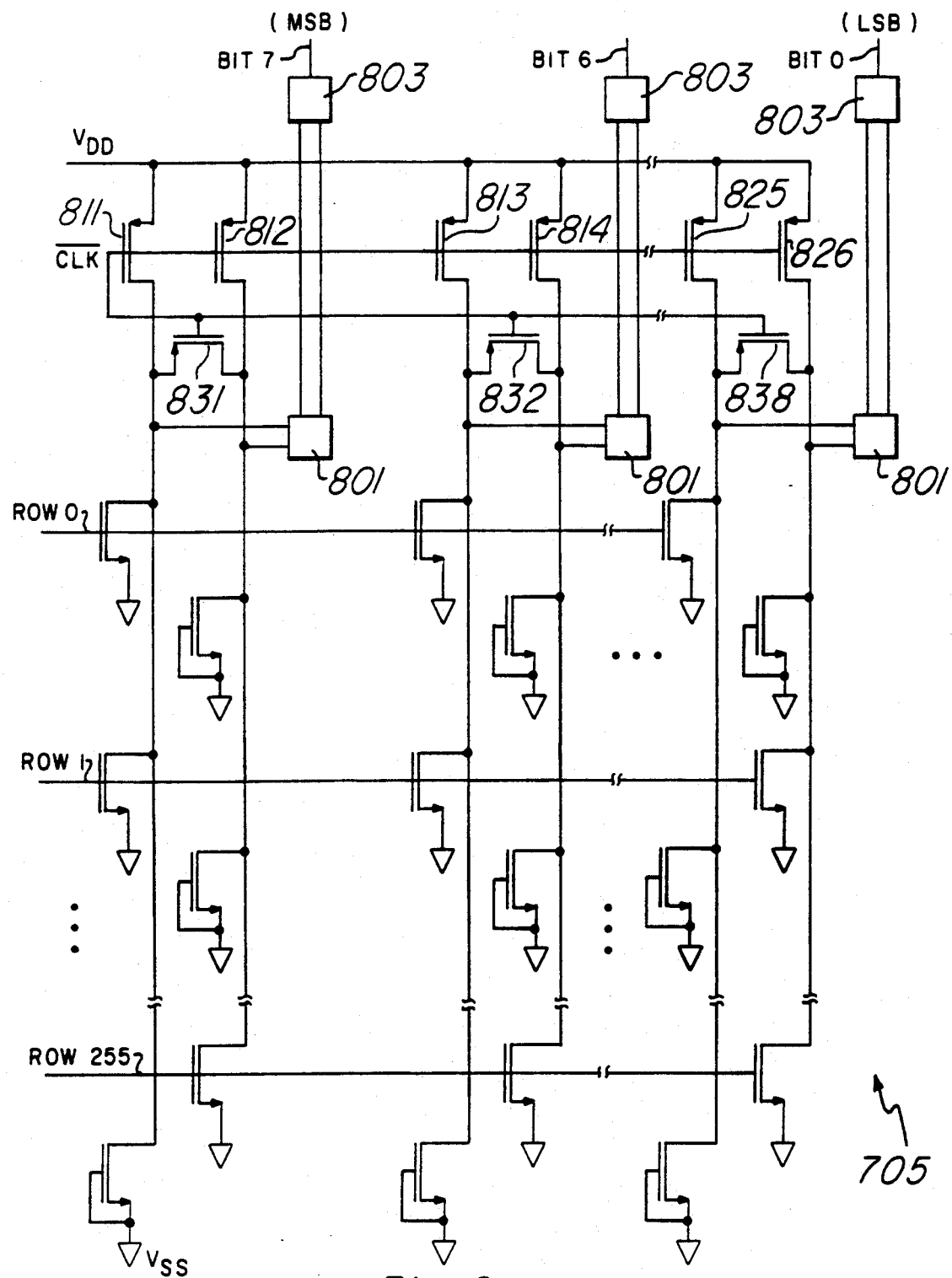
FIG. 8 is a schematic diagram of the encoder ROM.

FIG. 8 is a schematic diagram of ROM 705 and illustrates the 256 rows by 8 columns arrangement with each column having two bitlines, one for "1" and one for "0" for the bit defined by that column. Each column has a sense amplifier 801 for sensing potential differences between the two bitlines in the column and an output RS latch 803 for holding the sense amplifier output. Each bitline has 256 transistors, one for each row, with some of the transistors having their gates connected to the corresponding row conductor and the remaining being dummy transistors that provide capacitive loading equal to the other transistors when turned off. In each column if the "1" bitline has a connected transistor at the $j^{th}$ row, then the "0" bitline has a dummy transistor, and if the "1" bitline has a dummy transistor, then the "0" bitline has a connected transistor.

The output of the $j^{th}$ AND gate 703 is input to the $j^{th}$ row conductor. ROM 705 operates as follows: during a high phase of the clock, the outputs of the AND gates 703 are turned off and the row conductors are all grounded, thus all of the 256 transistors are turned off in each bitline. The twenty-four p channel transistors 811, 812, ..., 826 and 831, 832, ..., 838 are turned on to charge each of the bitlines up to about 4 to 4.2 volts, depending on whether the biltine was previously discharged or not and on the impedance of transistors 831, 832, ..., 838; the level of 4 to 4.2 volts depends upon the impedance of transistors 811, 812, ..., 826, the bitline capacitance, and the clock phase duration. Upon a transition to a low clock phase transistors 811, 812, ..., 826 and 831, 832, ..., 838 are turned off to isolate each bitline; and the AND gates 703 are turned on so that the $n^{th}$ row conductor goes high and the rest remain low. This turns on the eight transistors in the $n^{th}$ row that have gates connected to the row conductor and the corresponding bitlines are discharged to about 3 to 3.2 volts with this level determined by the impedance of the turned on transistor and the clock phase duration. Each of the eight sense amplifiers 801 is then activated and compares the potentials of the two bitlines in its column outputs a signal indicating whether its column is a "1" or "0" bit. The sense amplifier 801 output is held in latch 803. Note that the difference in potential between a charged bitline (4 to 4.2 volts) and a discharged bitline (3 to 3.2 volts) must be large enough to trigger sense amplifier 801, but that the difference between two charged bitlines (possibly 0.2 volt) preferably should not.

Some typical device characteristics that can provide 30 MHz operation are as follows: $V_{DD}$ of 5 volts, $V_{SS}$ of ground, n channel transistors 510 and 511 have gate lengths of 1 $\mu$m and gate widths of 16 $\mu$m; p channel transistors 512 and 513 have gate lengths of 1 $\mu$m and gate widths of 6 $\mu$m; p channel transistor 564 has a gate length of 2 $\mu$m and a gate width of 10 $\mu$m and provides about 15 microamps of bias current to be split between 510 and 511; capacitors 421 and 422 have capacitance of 0.13 pF; capacitors 531 and 532 have capacitances of 0.06 pF; and capacitors 533 and 534 have capacitance of 0.075 pF. Bias circuit transistors 551, 552, 553 are p channel with gate length and width of 2 $\mu$m and 2 $\mu$m, p channel with 2 $\mu$m and 3 $\mu$m, and n channel with 1 $\mu$m and 8 $\mu$m, respectively. A total power dissipation of 200 mW for converter 100 is obtainable.

MODIFICATIONS AND ADVANTAGES

Various modifications of the preferred embodiment devices and methods may be made while retaining the features of common mode feedback capacitors, common capacitors for offset cancellation and sampling analog input, nonsaturating sense with clamped nodes, quick discharge transistors, and nonsaturating ROM for high speed, low power operation.

For example, the converter architecture could be semi-flash (two-stage), pipelined, or other and still use comparator 300 for high speed, low power operation. Indeed, semi-flash converter typically consumes only 20% of the power of a comparable flash converter. Also, the ROM encoder may convert the temperature coded output to Gray code or some other code; the p and n channel devices may be intermingled with appropriate clocking changes; the number of comparators and resolution of the converters may be varied; and so forth.

The invention provides the advantages of high speed, low power operation.

What is claimed is:

1. An analog-to-digital converter comprising:
   (a) an analog input;
   (b) at least one reference input;
   (c) at least one comparator coupled to said analog input and said reference input, said comparator including a feedback sense amplifier with common mode feed through at each sense amplifier input, said common mode feed through provided by a capacitance coupling each said input to the drains of a differential pair transistor amplifier; and
   (d) an output coupled to said comparator.

2. The converter of claim 1, wherein:
   (a) said at least one reference input is a plurality of reference inputs derived from a voltage divider;
   (b) said at least one comparator is a plurality of comparators, one comparator for each of said reference inputs; and
   (c) said output includes an encoder with inputs coupled to said comparators.

3. The converter of claim 2, wherein:
   (a) said encoder includes pairs of bitlines for each output bit and a second sense amplifier for each of said pairs of bitlines, said bitlines charged by devices with impedance large enough to prevent saturation and discharged by devices with impedance large enough to prevent total discharge.

4. The converter of claim 1, wherein:
   (a) said comparator samples said analog input and said reference input and compensates for sense amplifier offset on a single pair of capacitors.

5. The converter of claim 1, wherein:
   (a) said sense amplifier contains a voltage differential limiter to prevent saturation by limiting a splitting of a current between two parallel devices.

6. The converter of claim 1, wherein:
   (a) said comparator including a sample-and-hold system that couples the inputs of said sense amplifier without total discharge.

7. A processing system, comprising:
(a) an analog input;
(b) an analog-to-digital converter coupled to said analog input and at least one reference input;
(c) said analog-to-digital converter including at least one comparator, said comparator including a feedback sense amplifier with common mode feed through at each sense amplifier input, said common mode feed through provided by a capacitance coupling each said input to the drains of a differential pair transistor amplifier;
(d) a digital signal processor coupled to said analog-to-digital converter; and
(e) an output coupled to said digital signal processor.

8. The system of claim 7, wherein:
(a) said an analog input is a video signal.

9. The system of claim 7, wherein:
(a) said comparator samples said analog input and a reference input and compensates for sense amplifier offset on a single pair of capacitors.

* * * * *